US012588198B2

(12) United States Patent
Chou et al.

(10) Patent No.: US 12,588,198 B2
(45) Date of Patent: Mar. 24, 2026

(54) PICK-UP STRUCTURE OF MEMORY DEVICE AND METHOD FOR MANUFACTURING MEMORY DEVICE

(71) Applicant: WINBOND ELECTRONICS CORP., Taichung City (TW)

(72) Inventors: Hsin-Hung Chou, Taichung City (TW); Cheng-Shuai Li, Taichung City (TW); Kao-Tsair Tsai, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 390 days.

(21) Appl. No.: 18/491,226

(22) Filed: Oct. 20, 2023

(65) Prior Publication Data

US 2024/0147717 A1 May 2, 2024

(30) Foreign Application Priority Data

Oct. 26, 2022 (TW) .................................. 111140650

(51) Int. Cl.
| *H10B 41/42* | (2023.01) |
| *H10B 12/00* | (2023.01) |
| *H10B 43/40* | (2023.01) |

(52) U.S. Cl.
CPC ............. *H10B 41/42* (2023.02); *H10B 43/40* (2023.02); *H10B 12/48* (2023.02)

(58) Field of Classification Search
CPC ...... H10B 41/42; H10B 43/40; H10B 12/033; H10B 12/00
See application file for complete search history.

(56) References Cited

U.S. PATENT DOCUMENTS

| 9,378,979 | B2 * | 6/2016 | Sim ........................ H10B 41/42 |
| 10,490,442 | B2 | 11/2019 | Chan et al. |
| 2011/0101433 | A1 * | 5/2011 | Kim ........................ H10D 1/68 |
| | | | 257/296 |
| 2012/0168955 | A1 * | 7/2012 | Chen ..................... H01L 23/528 |
| | | | 438/669 |
| 2015/0054176 | A1 | 2/2015 | Sim et al. |
| 2015/0371685 | A1 | 12/2015 | Shin et al. |
| 2017/0092638 | A1 * | 3/2017 | Jung ................... H01L 23/5286 |
| 2017/0098608 | A1 * | 4/2017 | Jung ........................ H10D 1/00 |
| 2022/0157826 | A1 * | 5/2022 | Liu ........................ H01L 21/308 |
| 2022/0415783 | A1 * | 12/2022 | Chou ..................... H10B 41/10 |
| 2023/0022941 | A1 * | 1/2023 | Lin ................... H01L 21/32139 |

FOREIGN PATENT DOCUMENTS

| TW | 202207424 A1 | 2/2022 |
| TW | 202232722 A1 | 8/2022 |

* cited by examiner

*Primary Examiner* — Scott B Geyer
(74) *Attorney, Agent, or Firm* — MUNCY, GEISSLER, OLDS & LOWE, P.C.

(57) ABSTRACT

A pick-up structure of a memory device and a method of manufacturing the memory device are provided. The pick-up structure includes pick-up electrode stripes. Each pickup electrode stripe includes a main body portion in the peripheral pick-up region and an extending portion extending from the main body portion to the memory cell region. The extending portion is narrower than the main body portion. The sidewall surface of the extending portion is aligned with the sidewall surface of the main body portion.

19 Claims, 13 Drawing Sheets

I                                              I'

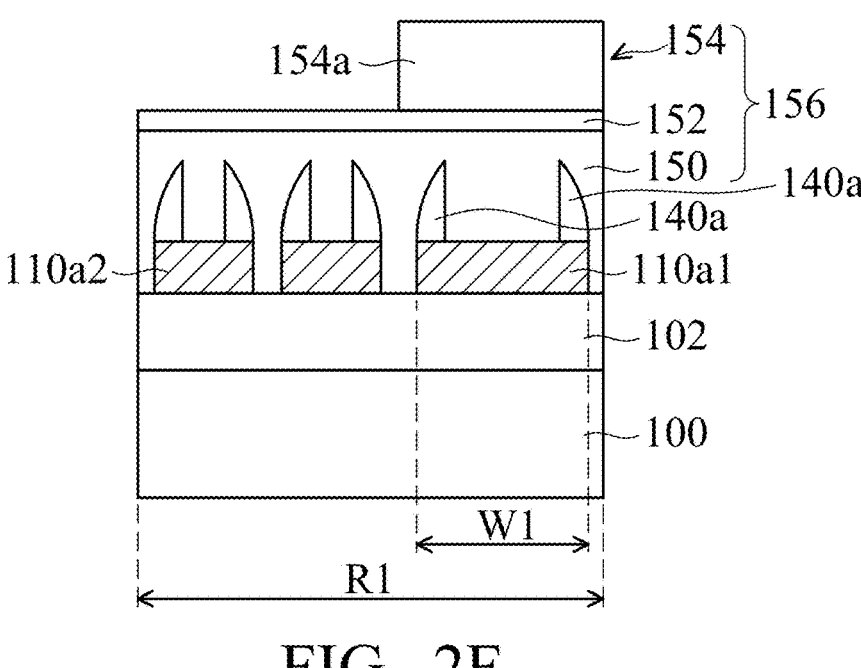
FIG. 2F
FIG. 2G
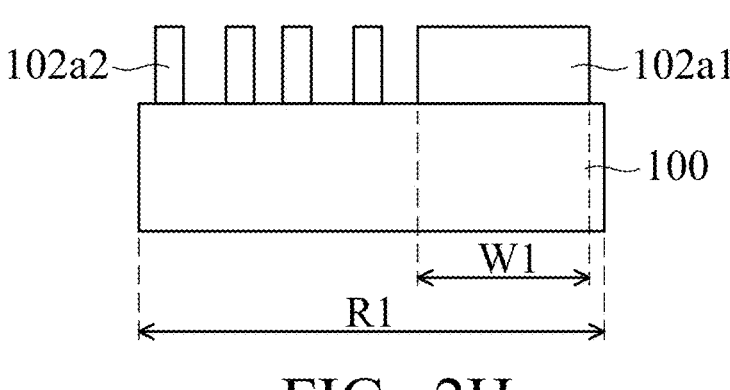
FIG. 2H

III                  III'

132

— 132c
— 130
— 120
— 110
— 102
— 100

R2

— 132c
— 130c1
— 120c1
— 110
— 102
— 100

R2

PICK-UP STRUCTURE OF MEMORY DEVICE AND METHOD FOR MANUFACTURING MEMORY DEVICE

CROSS REFERENCE TO RELATED APPLICATIONS

This application claims priority of Taiwan Patent Application No. 111140650 filed on Oct. 26, 2022, and entitled "PICK-UP STRUCTURE OF MEMORY DEVICE AND METHOD FOR MANUFACTURING MEMORY DEVICE", the entirety of which is incorporated by reference herein.

BACKGROUND OF THE INVENTION

Field of the Invention

The invention relates to a semiconductor structure, and in particular to a pick-up structure of a memory device and method for manufacturing memory device.

Description of the Related Art

With the increasing demand for miniaturization, how to increase the density of semiconductor devices has become an important issue. In processing semiconductor structures, a spacer self-aligned double patterning (SADP) process can be used to reduce the critical dimension (CD) of semiconductor devices, thereby increasing the integration of semiconductor structures. A conventional SADP process typically includes: forming a pattern composed of multiple sacrificial mandrels; forming a spacer layer on each of two opposite sidewalls of each sacrificial mandrel; removing the sacrificial mandrels to leave a pattern composed of the spacer layers; and defining the underlying layers using the pattern composed of the spacer layers.

In the process of forming semiconductor memory devices (e.g., flash memories), a SADP process is usually used to form small word lines, select gates, and pick-up electrodes for connecting word lines. However, if the overlay shift between the etch masks in the SADP process exceeds the process window, it becomes difficult for the line width of the select gate to reach the target size. This reduces the yield and reliability of the memory device.

In order to improve overlay control, it is necessary to use a high-resolution lithography process, which significantly increases the manufacturing costs. In addition, the pattern of a select gate can be defined prior to the removal of the sacrificial mandrel without improving overlay control. Later, when the pick-up electrode is defined, however, it is difficult to reach the target size for the line width of the pick-up electrode. As a result, it is challenging to form a contact on the top of the pick-up electrode, thereby reducing the yield and reliability of the memory device. Therefore, there is a need for a novel method for manufacturing a memory device capable of addressing or mitigating the aforementioned problems.

BRIEF SUMMARY OF THE INVENTION

The present embodiment provides a pick-up structure of a memory device and a method for manufacturing a memory device that can improve the yield and reliability of a memory device without significantly increasing the manufacturing cost or complicating the process.

In some embodiments, a pick-up structure of a memory device formed on a substrate having a memory cell region and a peripheral pick-up region adjacent thereto is provided. The pick-up structure includes pick-up electrode stripes. Each of the pick-up electrode stripes includes a main body portion in the peripheral pick-up region and extending in a first direction, and an extending portion extending from the main body portion to the memory cell region. The extending portion has a width less than a width of the main body portion. The extending portion has a sidewall surface that is aligned with the sidewall surface of the main body portion. The main body portions of the pick-up electrode stripes are arranged in a second direction. The second direction is different from the first direction.

In some embodiments, a method for manufacturing a memory device is provided. The method includes successively forming a first masking layer, a sacrificial material layer and a second masking layer on a substrate. The substrate has a memory cell region and a peripheral pickup region adjacent thereto. The method also includes forming a first pattern and a second pattern in the second masking layer. The first pattern corresponds to the memory cell region and includes first stripe patterns arranged in parallel with each other. The second pattern corresponds to the peripheral pick-up region and includes a block pattern and second stripe patterns connecting the block pattern and the first stripe patterns. The method further includes transferring the first pattern and the second pattern of the second masking layer into the sacrificial material layer, so that the sacrificial material layer has the first stripe patterns, the block pattern and the second stripe patterns. In addition, the method incudes removing the second masking layer having the first pattern and the second pattern and forming spacer layers over the first masking layer, so that sidewalls of each of the first stripe patterns and each of the second stripe patterns of the sacrificial material layer have corresponding spacer layers. The method also includes performing a first etching on the first masking layer by using the sacrificial material layer and the spacer layers as an etch mask, removing the sacrificial material layer and leaving the spacer layers after performing the first etching, and performing a second etching on the first masking layer by using the spacer layers as an etch mask, so that the first masking layer has a third pattern.

In the pick-up structure of the memory device in accordance with some embodiments, the width of the main body portion of each pick-up electrode stripe is larger than the width of the extending portion, so that it can be easily to form contact(s) over the main body portion of the pick-up electrode. Moreover, in the manufacturing method of the memory device in accordance with some embodiments, a block pattern is formed in the peripheral pick-up region. When the first masking layer in the memory cell region is patterned by a first etching, the block pattern can prevent the first masking layer in the peripheral pick-up region from being etched. As a result, when the first masking layer in the peripheral pick-up region is patterned by a second etching, the formed pattern will not be reduced/changed in critical dimension by the second etching. Therefore, it does not affect the subsequent contact fabrication.

BRIEF DESCRIPTION OF THE DRAWINGS

FIGS. 2A to 2H are cross-sectional views of various stages of manufacturing a memory device in accordance with some embodiments, in which FIG. 2A is a cross-sectional view taken along the line I-I' in FIG. 1A.

FIGS. 3A to 3H are cross-sectional views of various stages of manufacturing a memory device in accordance with some embodiments, in which FIG. 3A is a cross-sectional view taken along the line II-IF in FIG. 1A.

FIGS. 4A to 4H are cross-sectional views of various stages of manufacturing a memory device in accordance with some embodiments, in which FIG. 4A is a cross-sectional view taken along the line in FIG. 1A.

DETAILED DESCRIPTION OF THE INVENTION

Figure 1A:
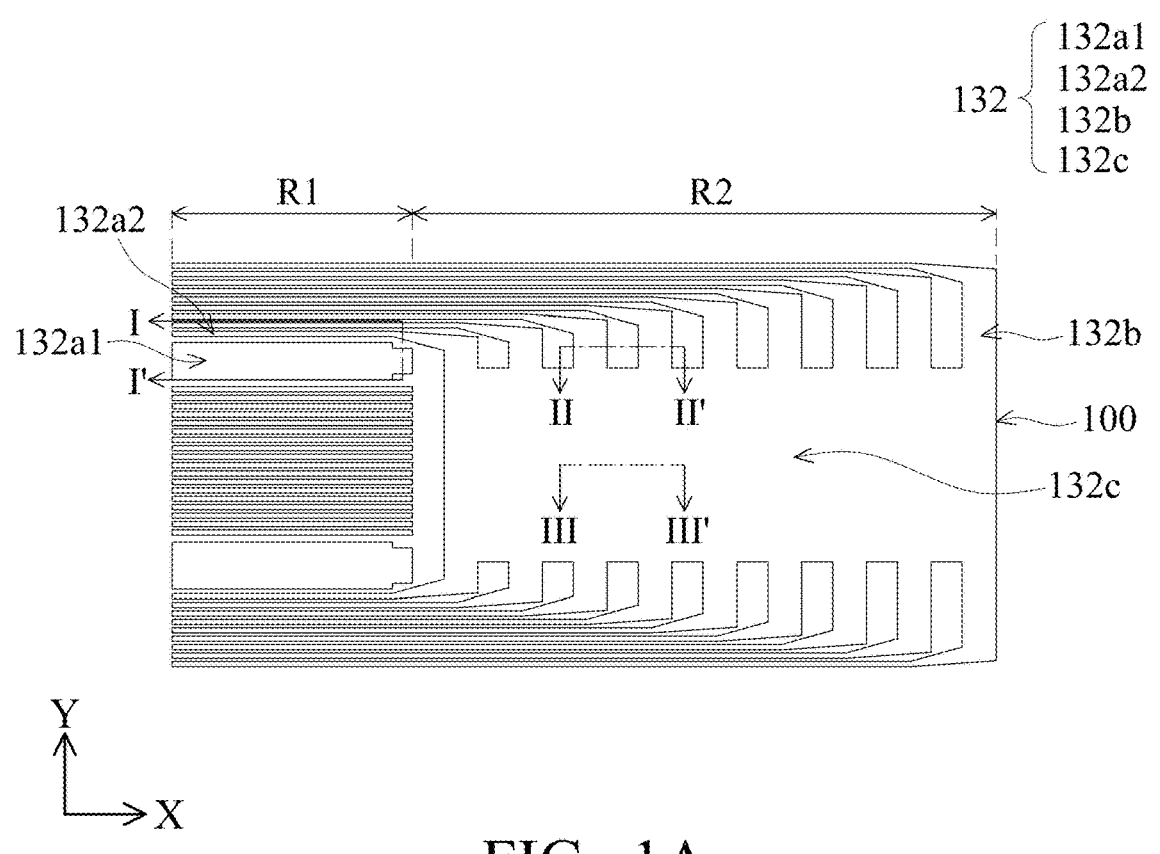
FIG. 1A is a plan view of a masking pattern layer for manufacturing a memory device in accordance with some embodiments.

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

Herein, the terms "approximately" and "about" usually mean within 20%, preferably within 10%, and preferably within 5% of a given value or range. The value given herein is an approximate value, meaning that the meaning of "approximately" and "about" can still be implied without specific specification.

As shown in FIGS. 1A, 2A, 3A, and 4A, a substrate 100 has a memory cell region R1 and a peripheral pick-up region R2 adjacent to the memory cell region R1. The substrate 100 may be a silicon substrate, a silicon-on-insulator (SOI) substrate, or another suitable semiconductor substrate (e.g., GaAs, GaN, or SiGe substrate). In some embodiments, the substrate 100 is a silicon substrate. Further, other structures (e.g., isolation structures, p-type implantation regions, or n-type implantation regions (not shown)) may be formed within the substrate 100.

Next, a target layer 102, a first masking layer 110, a sacrificial material layer 120, and a second masking layer 132 are successively formed on the substrate 100 to cover the memory cell region R1 and the peripheral pick-up region R2 of the substrate 100. In some embodiments, the target layer 102 may be a single-layer or multi-layer structure. For example, when the target layer 102 is a single-layer structure, the material of the target layer 102 may include a metal or another suitable conductive material. Alternatively, when the target layer 102 is a multi-layer structure, the target layer 102 may include a conductive layer and one or more overlying dielectric layers. The material of the conductive layer may include metal, doped polysilicon, or another suitable conductive material. The material of the dielectric layers may include silicon oxide, silicon nitride, silicon nitride, low k-value materials, or combinations thereof.

In some embodiments, the first masking layer 110 includes polycrystalline silicon or another suitable masking material. The sacrificial material layer 120 includes carbon or another suitable material. The first masking layer 110 and the second masking layer 132 include a photoresist material that can be patterned by a lithography process.

In some embodiments, a hard masking layer 130 is optionally formed between the sacrificial material layer 120 and the second masking layer 132. The hard masking layer 130 may be an anti-reflection coating layer and may include silicon nitride, silicon nitride oxide, or another suitable anti-reflection material. The target layer 102, the first masking layer 110, the sacrificial material layer 120, and the hard masking layer 130 may be formed by a suitable deposition process (e.g., a chemical vapor deposition process, an atomic layer deposition process, a spin coating process, or combinations thereof). In some embodiments, the second masking layer 132 serves as an etch mask for the subsequent etching process, and the second masking layer 132 has a first pattern and a second pattern corresponding to the memory cell region R1 and the peripheral pick-up region R2, respectively. More specifically, the first pattern includes a stripe pattern 132a1 and stripe patterns 132a2 that are arranged in parallel, in which the line width of the stripe pattern 132a1 is greater than the line width of the stripe patterns 132a2. In some embodiments, the stripe pattern 132a1 are employed to define the select gates of the memory device, and the stripe patterns 132a2 are employed to define the word lines of the memory device.

In addition, the second pattern includes stripe patterns 132b and a block pattern 132c, in which each stripe pattern 132b is connected to a corresponding one of the stripe patterns 132a2, and these stripe patterns 132b are connected to the block pattern 132c. In some embodiments, the stripe patterns 132b are employed to define portions of the pick-up electrode stripes. Moreover, the block pattern 132c serves as an etch blocking region while defining the select gates of the memory device, thereby preventing the layers directly below the block pattern 132c from being etched. In the embodiment, the block pattern 132c is rectangle-shaped, where the short side is not connected to the first pattern and the long side is connected to the stripe patterns 132b arranged in parallel along a second direction X. The short side of the block pattern 132c extends in a first direction Y and the long side extends in the second direction X.

Figure 1B:
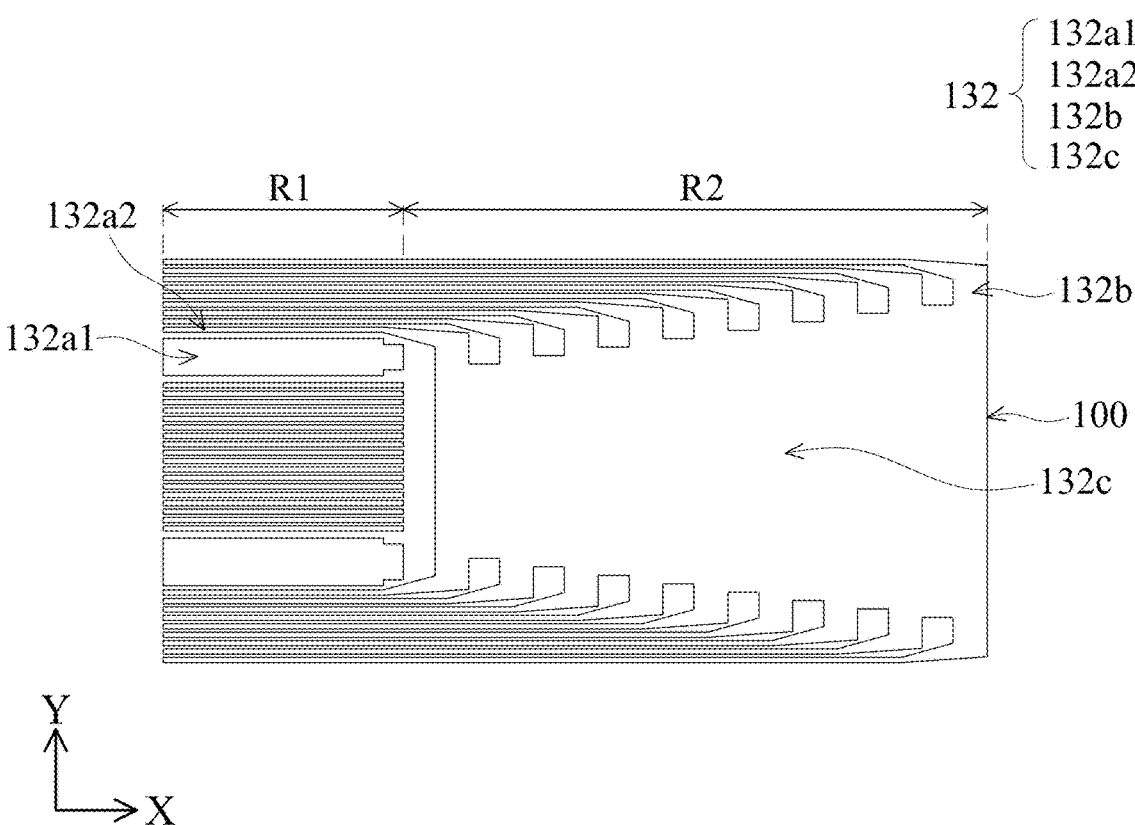
FIG. 1B is a plan view of a masking pattern layer for manufacturing a memory device in accordance with some embodiments.

However, the block pattern 132c is not limited to the rectangle shape. Referring to FIG. 1B, in the present embodiment, the block pattern 132c is a trapezoid-liked pattern having beveled sides with a multi-step contour, and the beveled sides connect to the stripe patterns 132b that are arranged in parallel along the second direction X.

Figure 2A:
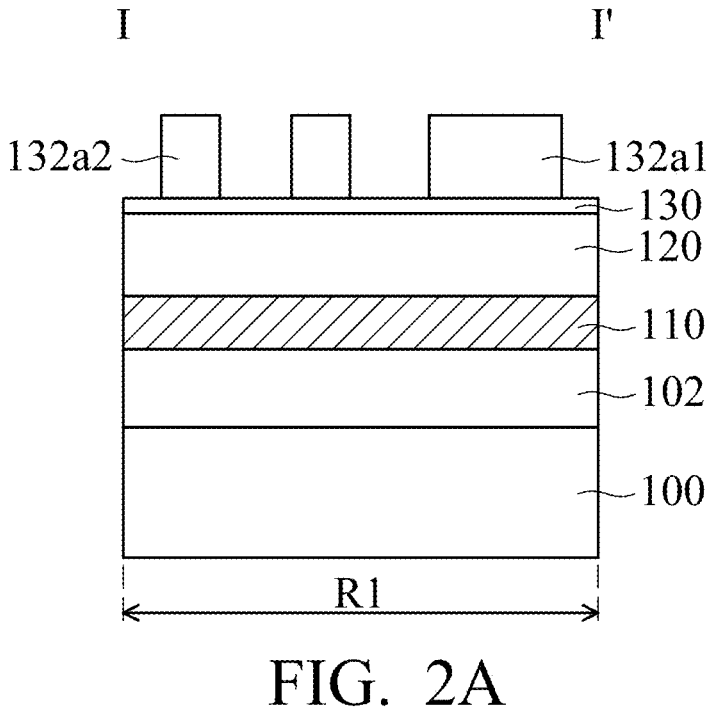
Figure 2B:
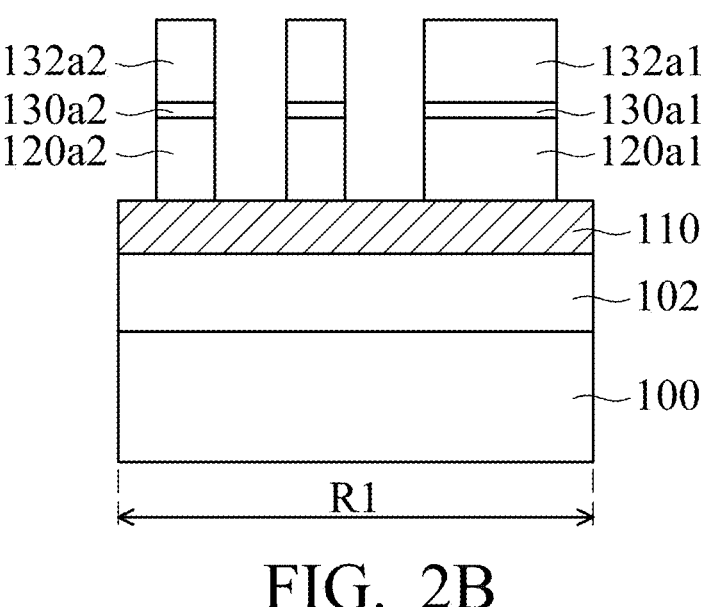
Figure 3A:
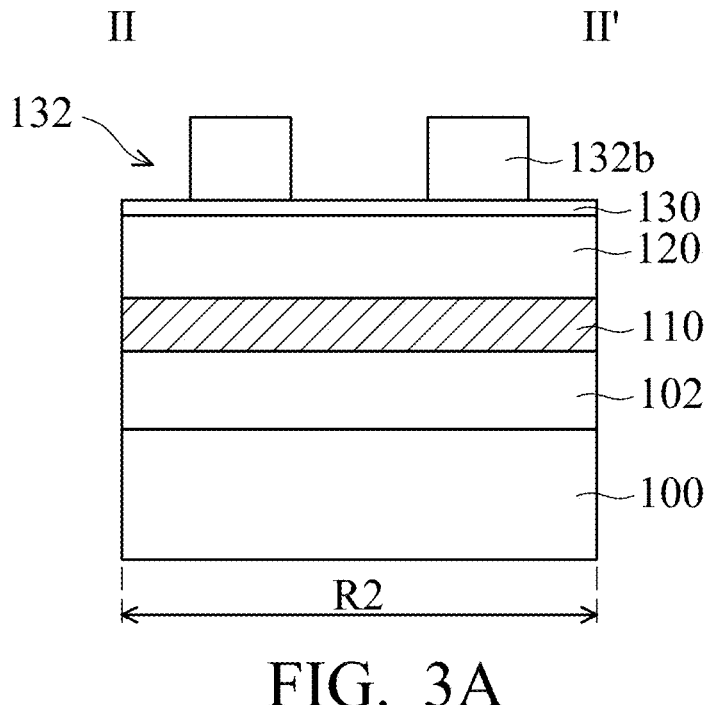
Figure 3B:
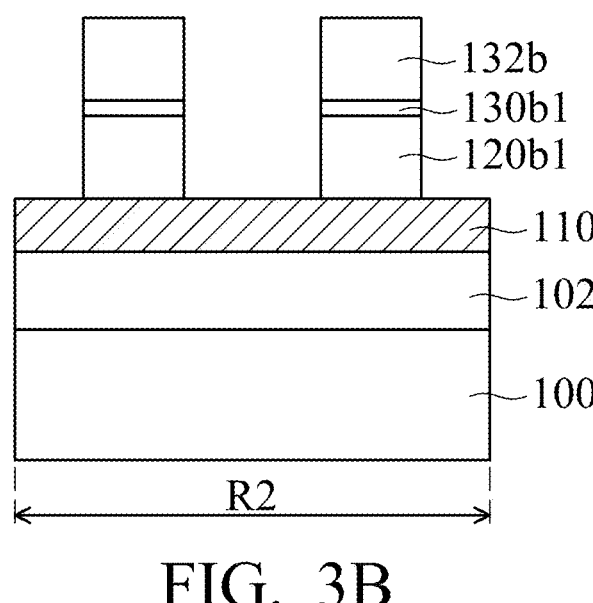
Figure 4A:
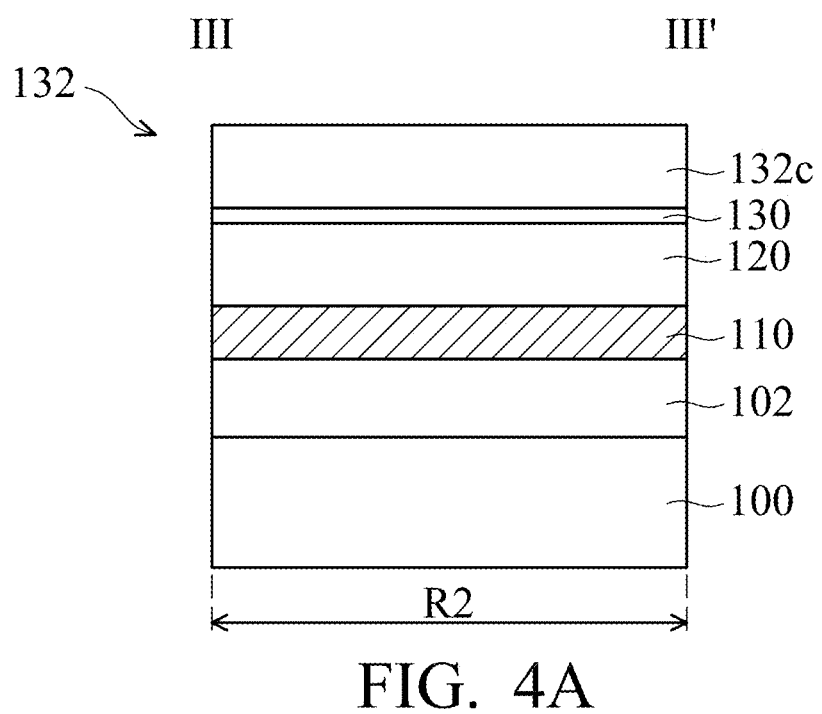
Figure 4B:
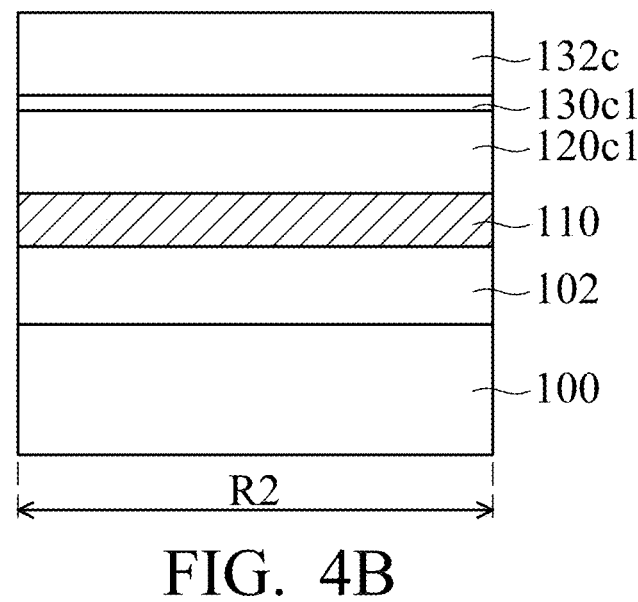

Next, referring to FIGS. 2B, 3B and 4B, the first pattern and the second pattern of the second masking layer 132 are transferred into the hard masking layer 130 and the sacrificial material layer 120 thereunder, to expose the upper surface of the first masking layer 110 in accordance with some embodiments. As a result, in the memory cell region R1, the hard masking layer 130 has stripe patterns 130a1 and 130a2 corresponding to the stripe pattern 132a1 and 132a2. Moreover, in the memory cell region R1, the sacrificial material layer 120 also has stripe patterns 120a1 and 120a2 corresponding to the stripe patterns 132a1 and 132a2. Similarly, in the peripheral pick-up region R2, the hard masking layer 130 has stripe patterns 130b1 corresponding to stripe patterns 132b, and the sacrificial material layer 120 has stripe patterns 120b1 corresponding to the stripe patterns 132b. Moreover, in the peripheral pickup region R2, the hard masking layer 130 and the sacrificial material layer 120 have block patterns 130c1 and 120c1, respectively, corresponding to the block pattern 132c. The hard masking layer 130 and the sacrificial material layer 120 (also referred to as a sacrificial mandrel) can be patterned by a suitable etching process (e.g., dry etching, wet etching, or a combination thereof)

Figure 2C:
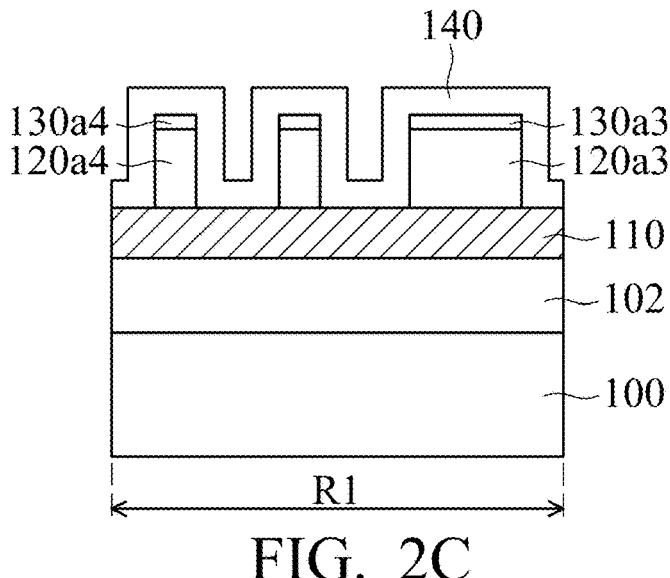
Figure 3C:
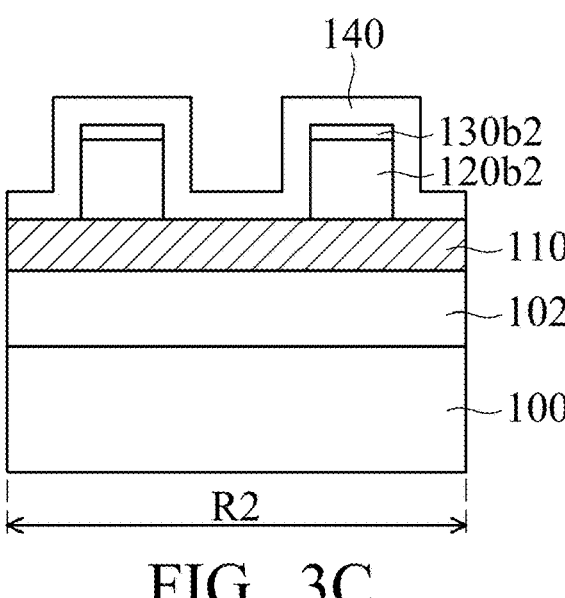
Figure 4C:
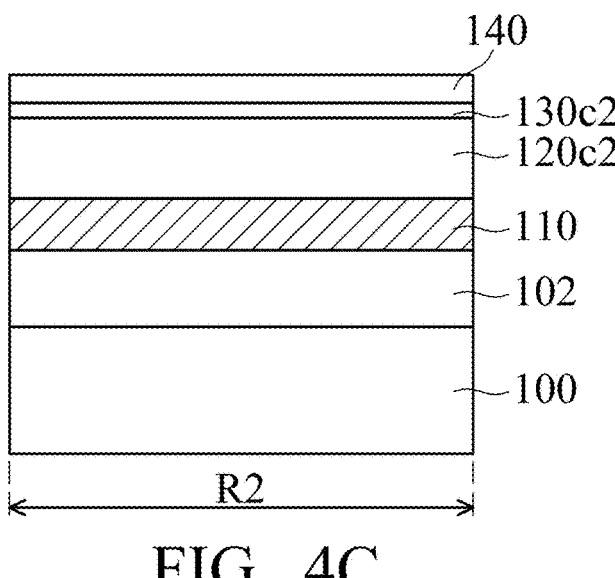

Next, also referring to FIGS. 2C, 3C, and 4C, the second masking layer 132 having the first pattern and the second pattern is removed to expose the sidewalls and upper surfaces of the stripe patterns 130a1 and 130a2, the stripe patterns 130b1 and the block pattern 130c1, and the upper surface of the first masking layer 110. In some embodiments, the stripe patterns 130a1, 130a2, 120a1, 120a2, 130b1, 120b1 and block pattern 130c1 and 120c2 may optionally be subjected to a trimming process to form corresponding trimmed stripe patterns 130a3, 130a4, 120a3, 120a4, 130b2, 120b2 with reduced line widths and trimmed block patterns 130c2 and 120c2 (hereinafter referred to as a trimmed masking structure). Afterwards, a spacer material layer 140 is conformally formed on the trimmed masking structure. In some embodiments, the material of the spacer material layer 140 includes silicon oxide.

Figure 2D:
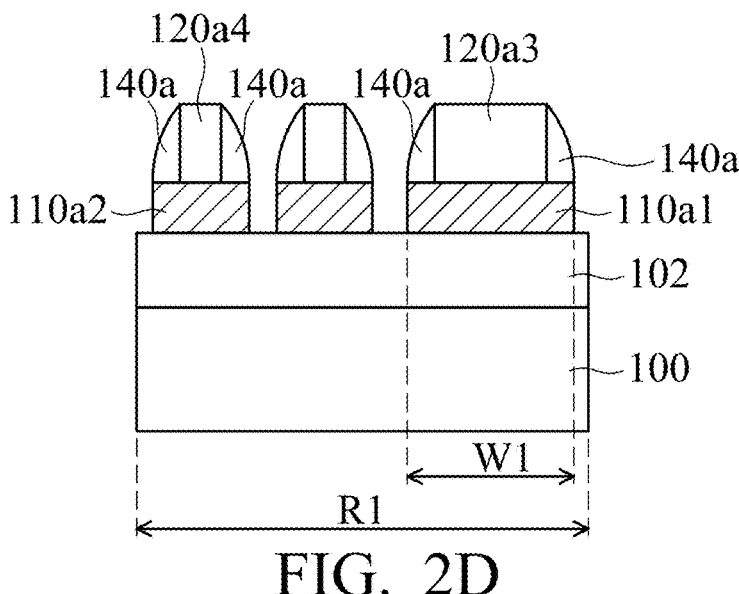
Figure 3D:
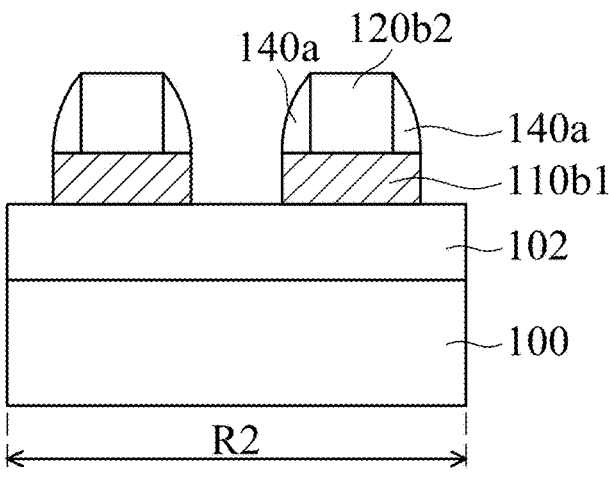
Figure 4D:
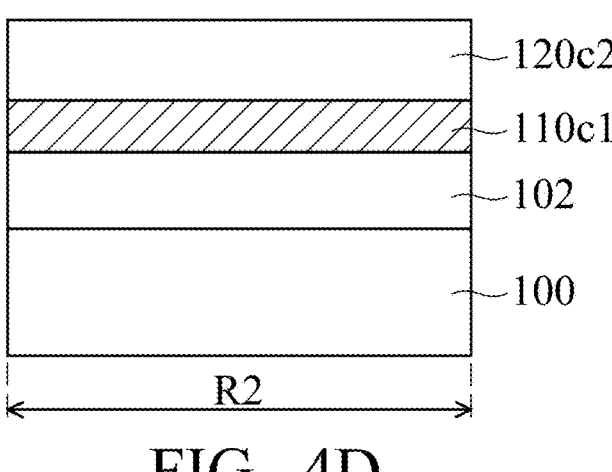
Figure 6A:
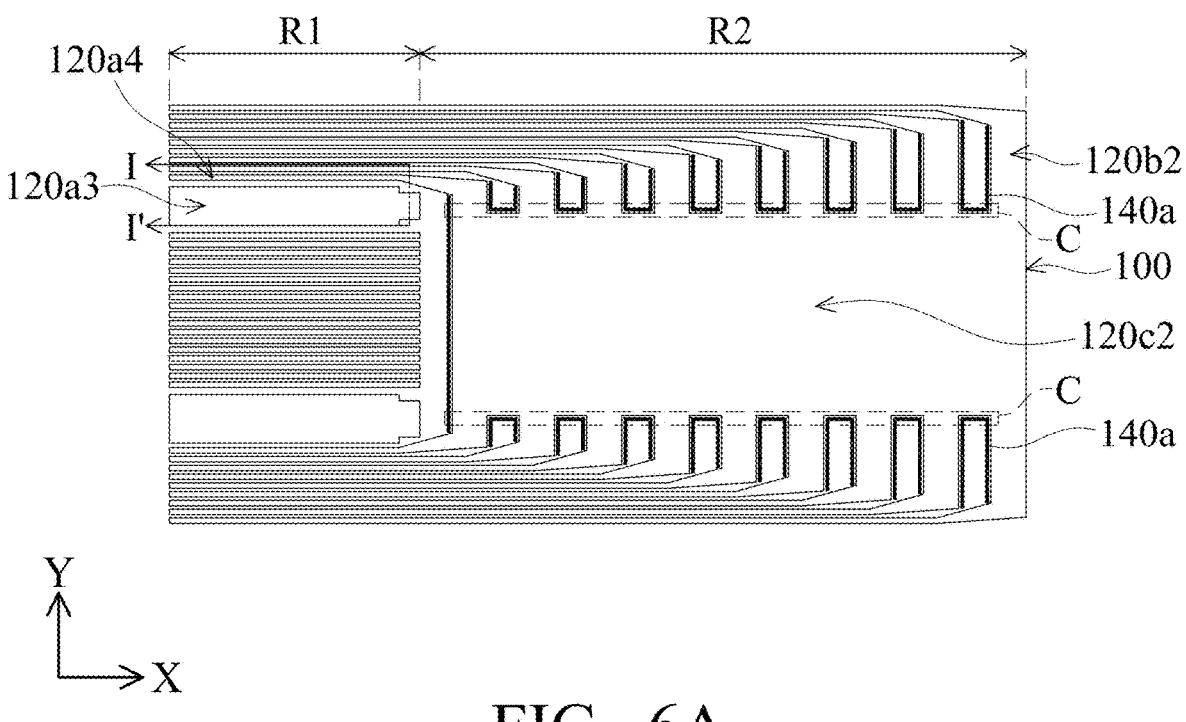
FIG. 6A is a plan view of a cutting region definition for patterning connected spacer layers in accordance with some embodiments.
Figure 6B:
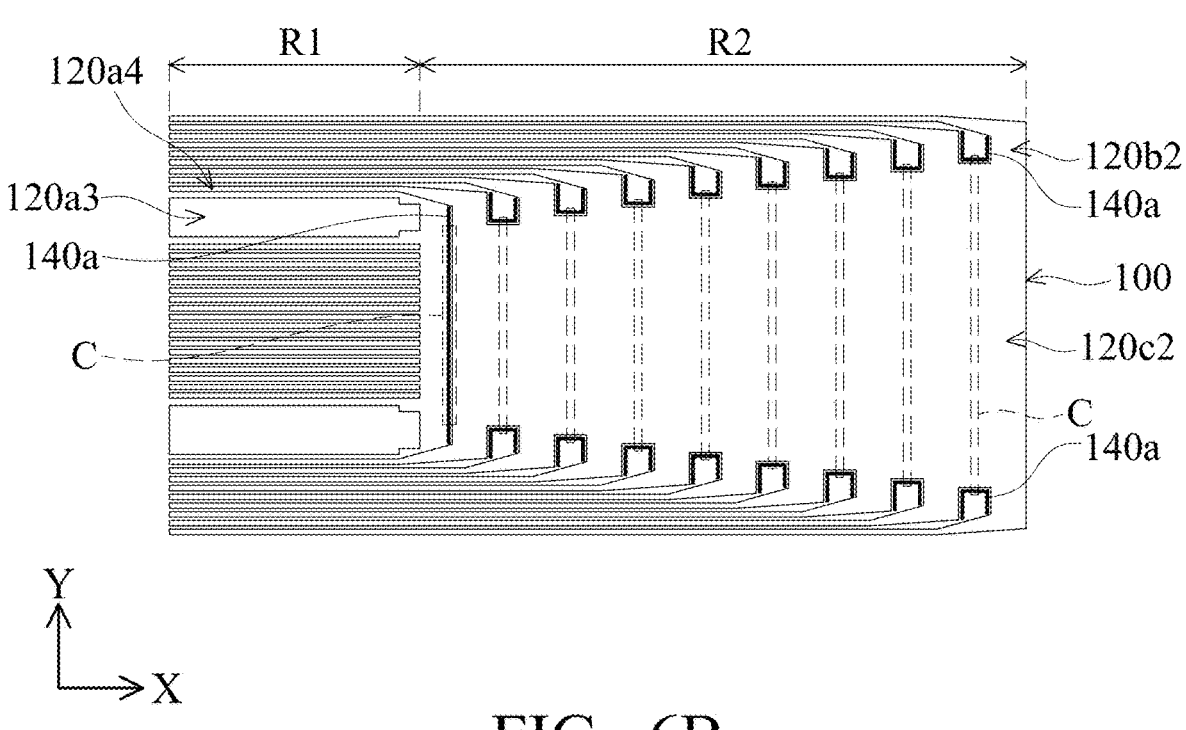
FIG. 6B is a plan view of a cutting region definition for patterning connected spacer layers in accordance with some embodiments.

Next, also referring to FIGS. 2D, 3D, and 4D, the spacer material layer 140 is etched to form spacer layers 140a on the first masking layer 110 and the sidewalls of the trimmed masking structure. The patterned hard masking layer 130 is then removed to expose the upper surfaces of the trimmed stripe patterns 120a3, 120a4 and 120b2 and the trimmed block pattern 120c2. Since the trimmed stripe patterns 120b2 in the peripheral pick-up region R2 is connected to the trimmed block pattern 120c2, the two adjacent spacer layers 140a formed between the two adjacent trimmed stripe patterns 120b2 are connected to each other to form a U-shaped structure. In some embodiments, such connected spacer layers 140a can be further patterned to ensure that the two adjacent spacer layers 140a between the two adjacent trimmed stripe patterns 120b2 are separated from each other. Referring to FIGS. 6A and 6B, which illustrate formed cutting regions C corresponding to the embodiments of FIGS. 1A and 1B, respectively.

In some embodiments, as shown in FIG. 6A, two adjacent spacer layers 140a between two adjacent trimmed stripe patterns 120b2 are connected in a second direction X, as viewed from a top-view perspective. In order to separate the spacer layers 140a that are connected in the second direction X, the cutting regions C is defined by a lithography process to extend in the second direction X. Each cutting region C is a linear region and overlaps with the connecting portion of the spacer layers 140a that extends in the second direction X and between the two adjacent trimmed stripe patterns 120b2. After the cutting regions C are defined, the connecting portion of spacer layers 140a within cutting region C and extending in the second direction X can be removed by etching methods.

In some other embodiments, as shown in FIG. 6B, two spacer layers 140a between the two adjacent trimmed stripe patterns 120b2 are connected in the second direction X, as viewed from a top-view perspective. In order to separate the connecting portions of the spacer layers 140a extending in the second direction X, cutting regions C extending in the first direction Y are defined by using a lithography process. The connecting portion of the spacer layers 140a extending in the second direction X and between a pair of adjacent trimmed stripe patterns 120b2 corresponds to one cutting region C, so that such a cutting region C partially overlaps the corresponding connecting portion of the spacer layers 140a, as viewed from a top-view perspective. After the cutting regions C are defined, the connecting portions of the spacer layers 140a in the cutting regions C can be removed by etching methods.

Afterwards, an etching process is performed on the first masking layer 110 by using together the patterned sacrificial material layer 120 and the spacer layers 140a as an etch mask. As a result, stripe patterns 110a1 and 110a2 are formed in the first masking layer 110 in the memory cell region R1, stripe patterns 110b1 and a block pattern 110c1 are formed in the first masking layer 110 in the peripheral pick-up region R2 (hereinafter collectively referred to as patterned first masking layer 110), and a portion of the upper surface of the target layer 102 are exposed. In some embodiments, the stripe pattern 110a1 is employed to define the select gate, and the line width W1 of the stripe pattern 110a1 is substantially equal to the target line width of the select gate. Moreover, the trimmed block pattern 120c2 serves as an etch blocking region to prevent the layer directly below it (e.g., the first masking layer 110) from being etched.

Figure 2E:
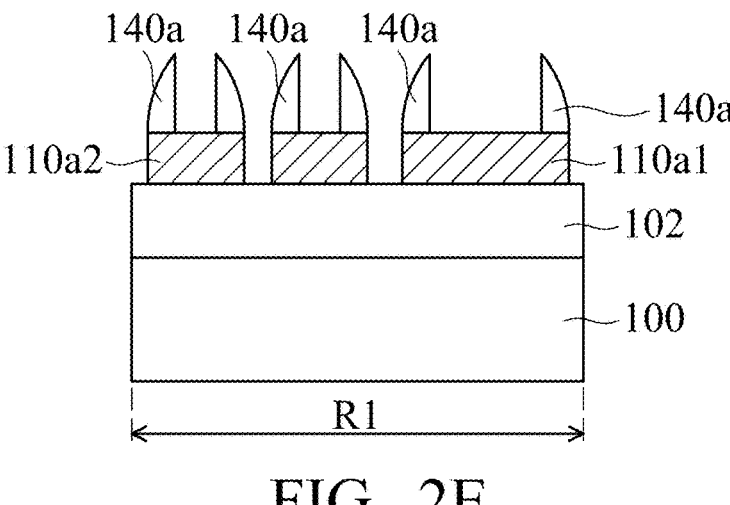
Figure 3E:
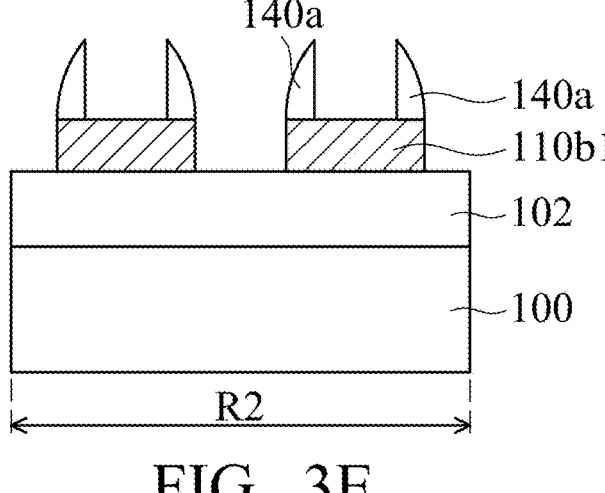
Figure 4E:
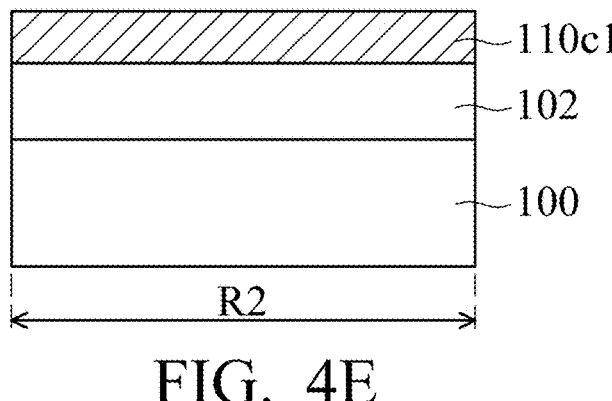

After forming the patterned first masking layer 110, the patterned sacrificial material layer 120 is removed and the spacer layers 140a on the patterned first masking layer 110 are left, as shown in FIGS. 2E, 3E, and 4E.

Figure 3F:
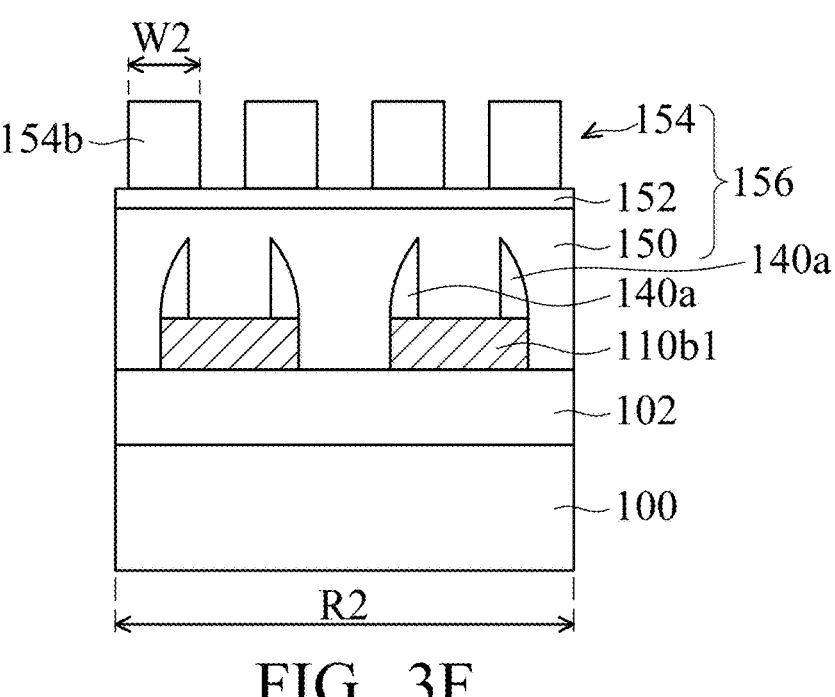
Figure 4F:
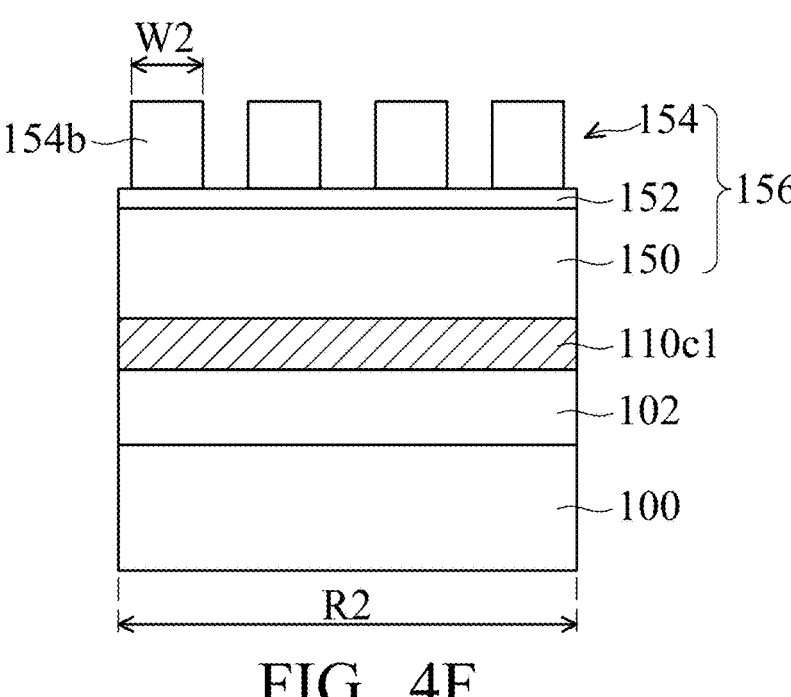
Figure 7A:
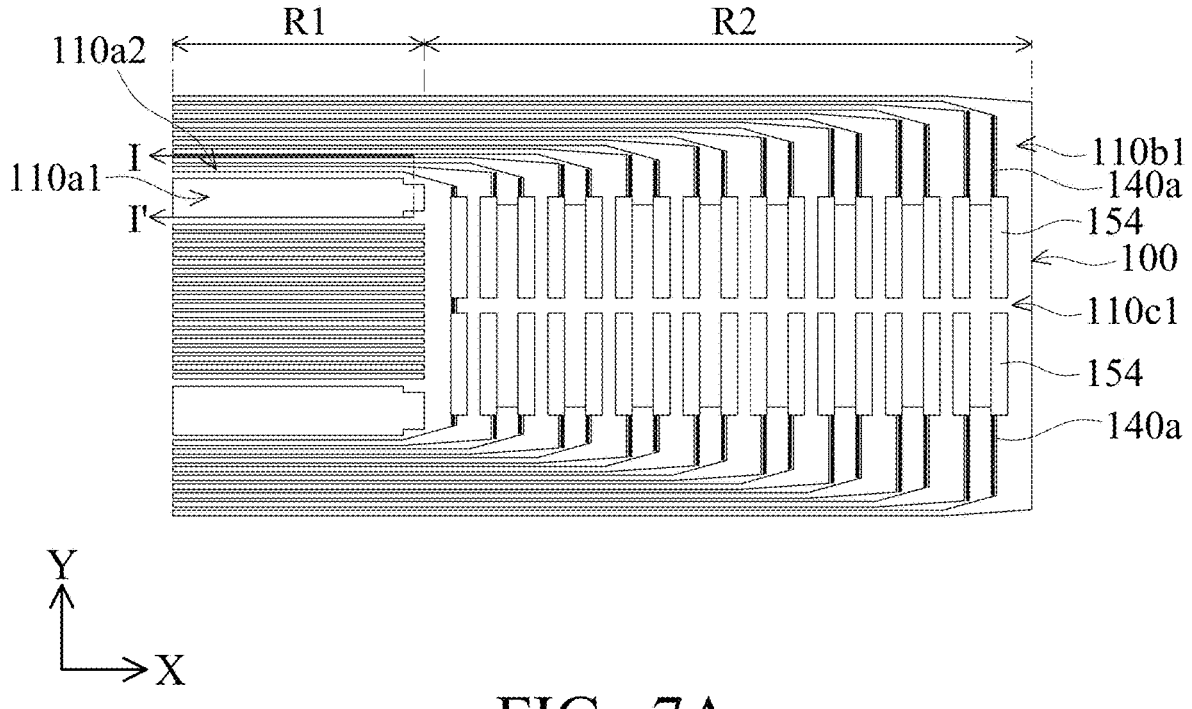
FIG. 7A is a plan view of the formation of a top pattern layer in accordance with some embodiments.
Figure 7B:
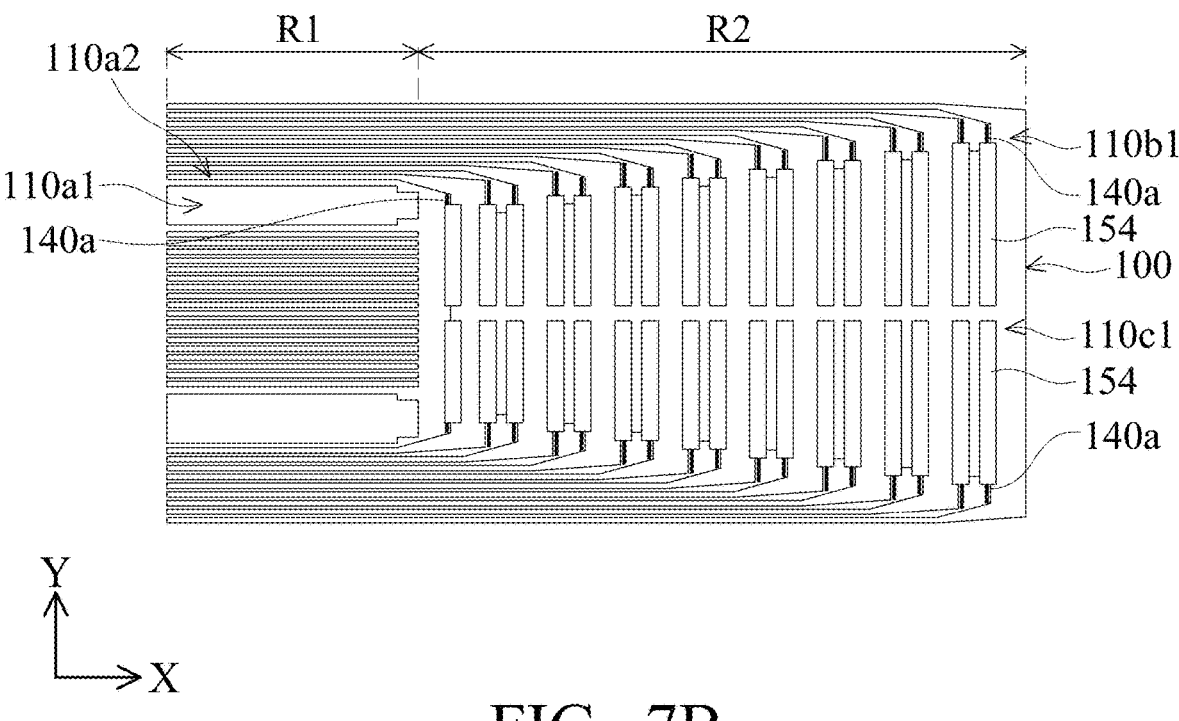
FIG. 7B is a plan view of the formation of a top pattern layer in accordance with some embodiments.

Next, also referring to FIGS. 2F, 3F and 4F, a masking structure 156 is formed over the spacer layers 140a and the patterned first masking layer 110 in accordance with some embodiments. In this embodiment, the masking structure 156 is a multi-layer resist structure, for example, including and not limited to a bottom layer 150, a middle layer 152 and a top pattern layer 154. Referring to FIGS. 7A and 7B, which illustrate plan views of the formation of a top pattern layer 154 corresponding to the embodiments of FIGS. 1A and 1B, respectively. In some embodiments, as shown in FIG. 7A, two top pattern layers 154 are formed between two adjacent stripe patterns 110b1, as viewed from a top-view perspective. Each top pattern layer 154 extends in the first direction Y and partially covers a corresponding portion of spacer layer 140a extending in the first direction Y. Each of the top pattern layers 154 is a linear layer and has substantially the same width and length. In some other embodiments, as shown in FIG. 7B, the arrangement of the top pattern layer 154 is similar to the arrangement of the top pattern layer 154 in FIG. 7A, as viewed from a top-view perspective. However, the difference is that the top pattern layers 154 in FIG. 7B have different lengths corresponding to the same stripe pattern 110b1. For example, the top pattern layer 154 on the right side of the stripe pattern 110b1 has a greater length than the top pattern layer 154 on the left side of this stripe pattern 110b1, as viewed from a top-view perspective. Moreover, the length of the top pattern layers 154 on both sides of the relatively right side of the stripe pattern 110b1 is also longer than the length of the top pattern layers 154 on both sides of the relatively left side of the stripe pattern 110b1.

In some embodiments, the bottom layer 150 serves as a planarization layer that provides a substantially flat upper surface. More specifically, the bottom layer 150 includes a spin on carbon (SOC) layer or other material with anti-reflection properties. Further, middle layer 152 provides hard masking properties to the overlying top pattern layer 154, and the material of middle layer 152 may include silicon oxide, silicon nitride, silicon carbon oxide, or another suitable masking material. In addition, the top pattern layer 154 has stripe patterns 154a, and the shape of the stripe pattern 154a is similar to and located on the corresponding stripe pattern 110a1 that is employed to define the select gate. The stripe patterns 154a expose a region (not shown) in the memory cell region R1 where word lines are to be formed, and serves as an etch blocking region to prevent the underlying stripe pattern 110a1 from being etched during the subsequent etching(s). As a result, the line width of the stripe pattern 110a1 is maintained. The top pattern layer 154 corresponding to the peripheral pick-up region R2 has stripe patterns 154b that defines the pick-up electrode stripe patterns in the subsequent processes. The line width W2 of the stripe patterns 154b is substantially equal to the target line width of the pick-up electrode stripes, and each stripe pattern 154b at least partially overlaps with the vertical projection of the spacer layer 140a (as shown in FIGS. 7A and 7B). The top pattern layer 154 may include a photoresist material and may be formed by a lithography process.

Figure 3G:
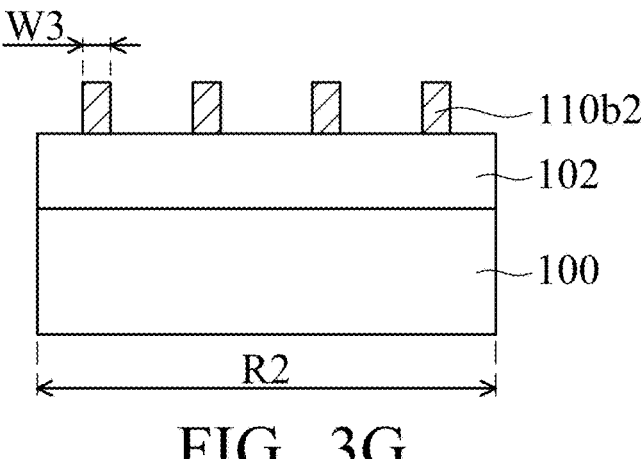
Figure 4G:
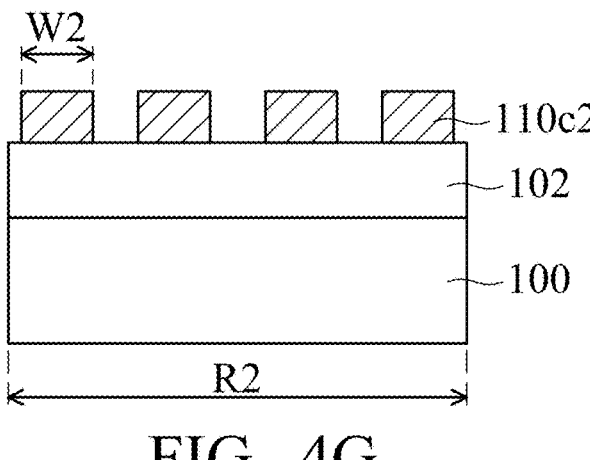

Next, referring to FIGS. 2G, 3G, and 4G, the first masking layer 110 is repatterned by using the combination of spacer layer 140a and the masking structure 156 as an etch mask, to form a third pattern therein and expose the upper surface of the underlying target layer 102. Such a process for repatterning first masking layer 110 may include a dry etching process, a wet etching process, or a combination thereof. After such a patterning process, the spacer layers 140a and the masking structure 156 are removed.

More specifically, the third pattern includes stripe patterns 110a3 corresponding to the memory cell region R1 (i.e., the patterns employed to define the word lines) and previously formed stripe pattern 110a1. The line width of the stripe patterns 110a3 is substantially determined by the width of the spacer layers 140a, and the width of the spacer layers 140a is controlled by the deposited thickness of the spacer material layer 140. Moreover, the third pattern also includes stripe patterns 110b2 and stripe patterns 110c2 that correspond to peripheral pick-up region R2 and are aligned with each other.

As shown in FIGS. 2F and 2G, before forming the stripe patterns 110a3 for defining the word lines, the first masking layer 110 already has stripe pattern 110a1 for defining the select gate. Therefore, even if the overlap shift between the stripe patterns 154a and the underlying spacer layers 140a occurs, the line width W1 of the stripe pattern 110a1 remains unchanged during repatterning the patterned first masking layer 110, thereby effectively increasing the overlay window. As a result, when the target line width of the select gate decreases as the size of the memory device decreases, it is still possible to use a lower resolution lithography process to avoid an increase in manufacturing cost.

As shown in FIGS. 3F and 3G, during forming the patterns that are employed to define the select gate (i.e., the stripe pattern 110a1) in the first masking layer 110, stripe patterns 110b1 are simultaneously formed in the peripheral pick-up region R2. Therefore, after the patterned first masking layer 110 is repatterned, the line width W3 of the formed stripe patterns 110b2 is narrower than the line width W2 of the stripe patterns 154b (i.e., the line width of the extending portion of the subsequently formed pick-up electrode stripes is less than the target line width).

As shown in FIGS. 4F and 4G, for the stripe pattern 154b directly above the block pattern 110c1 of the first masking layer 110, it is a flat layer having a large area with free pattern. Therefore, the critical dimension (CD) variation that occurs due to the topography of the underlying layer during the formation of the stripe pattern 154b can be prevented. Moreover, the line width W2 of the stripe patterns 110c2 formed after repatterning the patterned first masking layer 110 is substantially equal to the line width W2 of the stripe patterns 154b (i.e., substantially equal to the target line width of the main body portion of the pick-up electrode stripes).

Figure 3H:
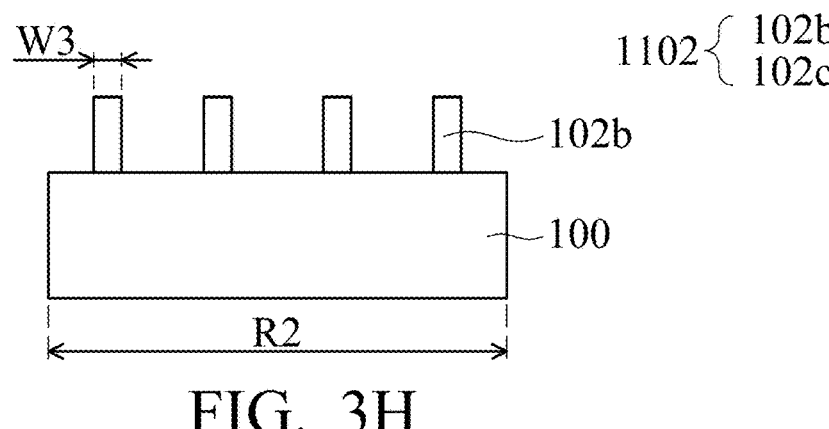
Figure 4H:
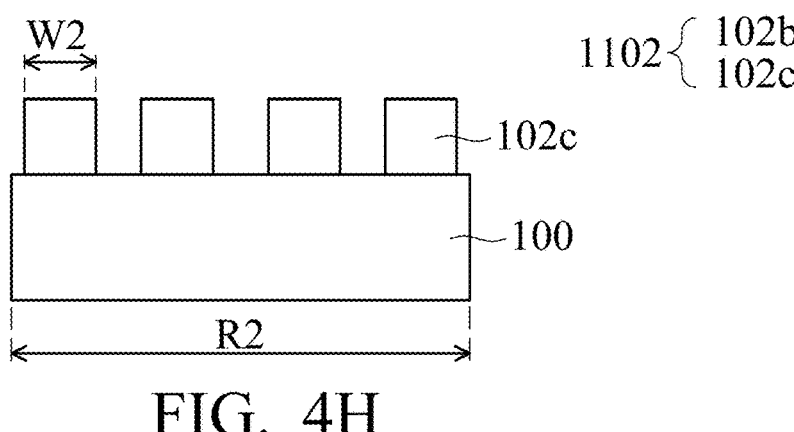

Next, also referring to FIGS. 2H, 3H, and 4H, the third pattern of the first masking layer 110 is transferred into the target layer 102. More specifically, the target layer 102 is etched by, for example, dry etching process, wet etching process, or a combination thereof, using the first masking layer 110 with the third pattern as an etch mask, to form such a third pattern in the target layer 102.

After the target layer 102 is etched, a select gate structure 102a1 with a target line width W1 and word lines 102a2 with a target line width are formed on the substrate 100 of the memory cell region R1. A pick-up structure is formed on the substrate 100 of the peripheral pick-up region R2, which includes pick-up electrode stripes 1102, and each of the pick-up electrode stripes 1102 includes an extending portion 102b and a main body portion 102c.

Figure 5A:
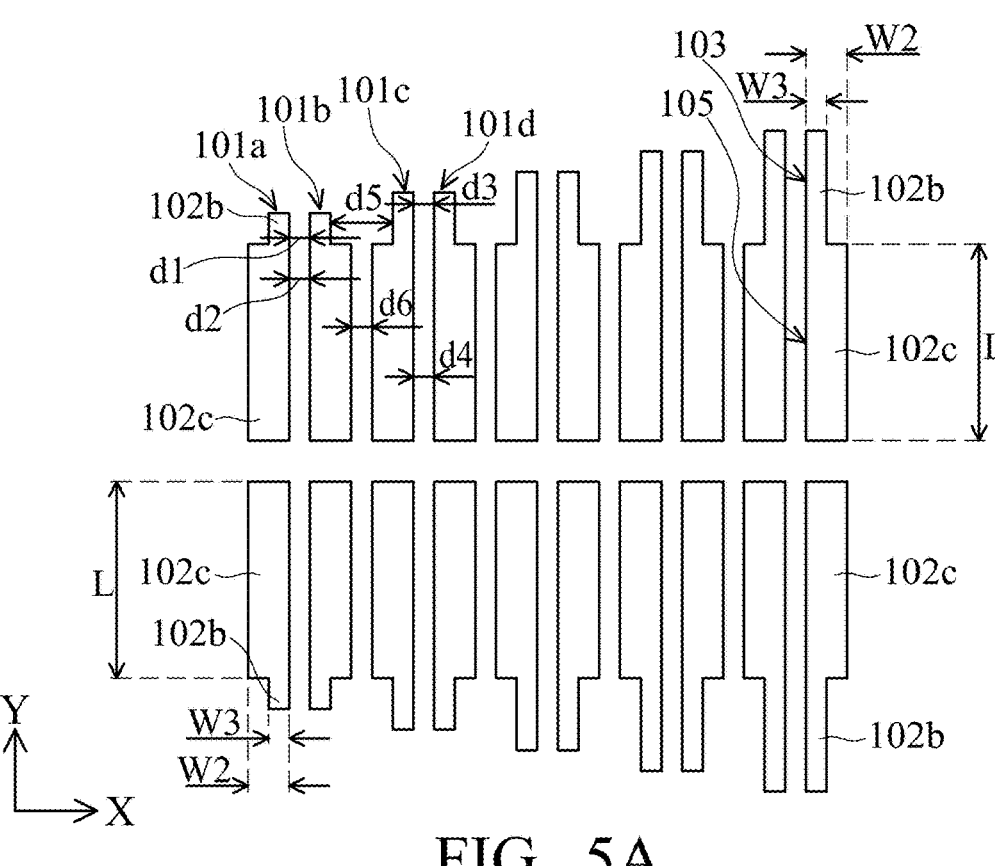
FIG. 5A is a plan view of a partial pick-up structure in accordance with some embodiments.

Referring to FIG. 5A, which illustrates a plan view of a partial pick-up structure in accordance with some embodiments. The pick-up structure shown in FIG. 5A is manufactured using the second masking layer 132 shown in FIG. 1A and the method shown in FIGS. 2A-2H, 3A-3H and 4A-4H. As shown in FIG. 5A, the pick-up electrode stripes have a extending direction parallel to the first direction Y and are arranged on the substrate 100 in a second direction X that is different from the first direction Y. In order to simplify the diagram, only two pick-up structures that are mirror-symmetrical up and down are depicted in FIG. 5. Each of the pick-up structures includes ten pick-up electrode stripes. However, it is understood that the number of pick-up electrode stripes depends on the design requirements and is not limited to the embodiment shown in FIG. 5A.

In some embodiments, each pick-up electrode stripe includes an extending portion 102b and a main body portion 102c. The main body portion 102c is located in the peripheral pick-up region R2 (not shown, and indicated in FIG. 4H), and the extending portion 102b extends from the main body portion 102c to the memory cell region R1 (not shown). In some embodiments, the width of the extending portion 102b (which is substantially equal to the line width W3 of the stripe pattern 110b2) is narrower than the width of the main body portion 102c (which is substantially equal to the line width W2 of the stripe pattern 110c2), and the sidewall surface 103 of the extending portion 102b is aligned with the sidewall surface 105 of the main body portion 102c.

To simplify the description of the pick-up electrode stripe configuration, only the first pick-up electrode stripe 101a, the second pick-up electrode stripe 101b, the third pick-up electrode stripe 101c, and the fourth pick-up electrode stripe 101d, which are sequentially arranged in the second direction X, are used here as an example. In this example, the main body portion 102c of each pick-up electrode stripe has the same length L. Moreover, the first pick-up electrode stripe 101a and the second pick-up electrode stripe 101b are in a mirror-symmetrical arrangement, and the third pick-up electrode stripe 101*c* and the fourth pick-up electrode stripe 101*d* are in a mirror-symmetrical arrangement.

The distance d1 separating the extending portion 102*b* of the first pick-up electrode stripe 101*a* from the extending portion 102*b* of the second pick-up electrode stripe 101*b* is substantially equal to the distance d2 separating the main body portion 102*c* of the first pick-up electrode stripe 101*a* from the main body portion 102*c* of the second pick-up electrode stripe 101*b*. Similarly, the distance d3 separating the extending portion 102*b* of the third pick-up electrode stripe 101*c* from the extending portion 102*b* of the fourth pick-up electrode stripe 101*d* is substantially equal to the distance d4 separating the main body portion 102*c* of the third pick-up electrode stripe 101*c* from the main body portion 102*c* of the fourth pick-up electrode stripe 101*d*.

The distance d5 separating the extending portion 102*b* of the second pick-up electrode stripe 101*b* from the extending portion 102*b* of the third pick-up electrode stripe 101*c* is greater than the distance d6 separating the main body portion 102*c* of the second pick-up electrode stripe 101*b* from the main body portion 102*c* of the third pick-up electrode stripe 101*c* and also greater than the distances d1 and d2.

Figure 5B:
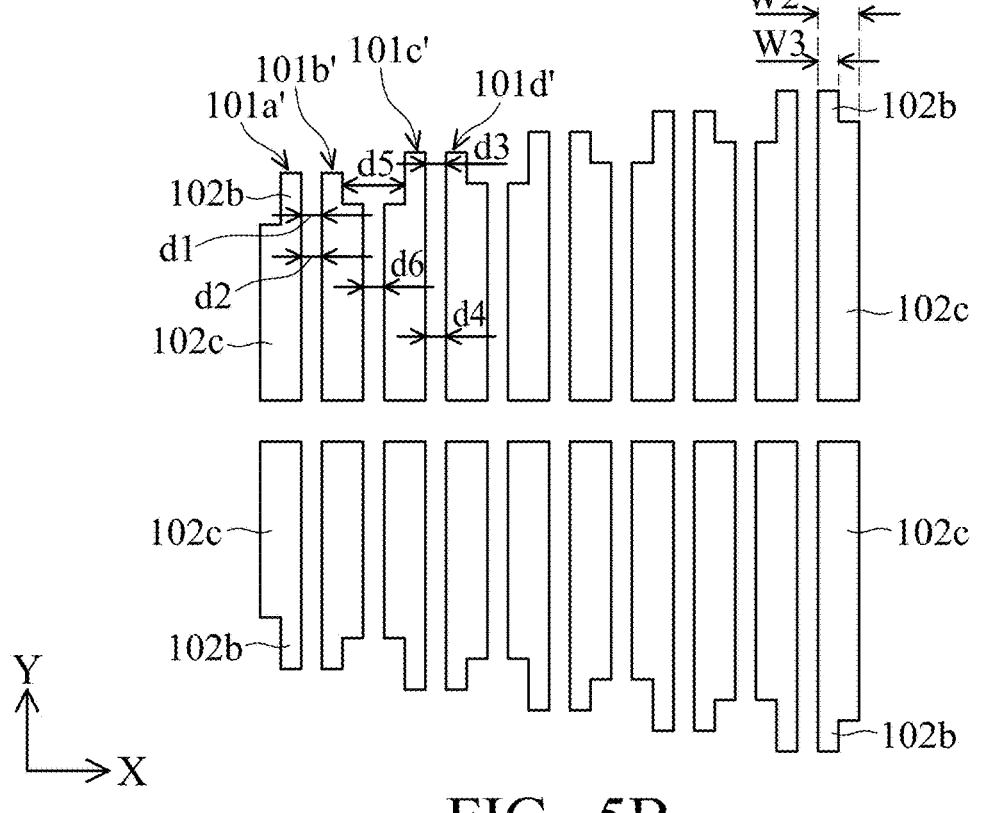
FIG. 5B is a plan view of a partial pick-up structure in accordance with some embodiments.

Referring to FIG. 5B, which illustrates a plan view of a partial pick-up structure in accordance with some embodiments. The pick-up structure shown in FIG. 5B is manufactured using the second masking layer 132 shown in FIG. 1B and the method shown in FIGS. 2A-2H, 3A-3H and 4A-4H. Therefore, the configuration of the pick-up electrode stripes shown in FIG. 5B is similar to the configuration of the pick-up electrode stripes shown in FIG. 5A. To simplify the description, only the first pick-up electrode stripe 101*a'*, the second pick-up electrode stripe 101*b'*, the third pick-up electrode stripe 101*c'*, and the fourth pick-up electrode stripe 101*d'*, which are sequentially arranged in the second direction X, are used here as an example. Unlike the example in FIG. 5A, the length of the main body portion 102*c* of the second pick-up electrode stripe 101*b'* is substantially equal to the length of the main body portion 102*c* of the third pick-up electrode stripe 101*c'*, but is longer than the length of the main body portion 102*c* of the first pick-up electrode stripe 101*a'* and shorter than the length of the main body portion 102*c* of the fourth pick-up electrode stripe 101*d'*.

According to the foregoing embodiments, since the pattern for defining the select gate is firstly defined in the memory cell region prior to the removal of the patterned sacrificial material layers (sacrificial mandrels), the overlay window can be effectively increased. As a result, when the target line width of the select gate is reduced as the size of the memory device is reduced, the original lithography process can be used instead of the high-resolution lithography process, thereby avoiding the increase in manufacturing cost.

According to the above embodiment, a block pattern is firstly formed in the peripheral pick-up region as an etching blocking layer by a lithography process before performing an etching (patterning) process. Therefore, after the pick-up electrode stripes are defined, the main body portions of the pick-up electrode stripes corresponding to the position of the block pattern can maintain their target line width without being affected by the etching process performed to define the select gate. As a result, the pick-up electrode stripe has a paddle shape because the line width of the main body portion of the pick-up electrode stripe is larger than the line width of extending portion of the pick-up electrode stripe. Therefore, contacts can be easily formed over the main body portion of the pick-up electrode stripe. Namely, the electrical connection between the contact and the pick-up electrode stripe is robust and reliable, thereby increasing the yield and reliability of the memory device.

The present invention is suitable for making miniaturized memory devices, for example, NAND flash memories, so as to increase the total number of dies on a wafer. Therefore, the production cost and energy consumption of manufacturing a single IC are reduced, and the production energy consumption of subsequent packaging is also reduced, thereby reducing carbon emissions in the process of producing flash memory. Besides, since reliability and yield of the memory device of the present invention are improved, the present invention provides a sustainable memory device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pick-up structure of a memory device, formed on a substrate having a memory cell region and a peripheral pick-up region adjacent thereto, the pick-up structure comprising:
   a plurality of pick-up electrode stripes, wherein each of the pick-up electrode stripes comprises:
   a main body portion in the peripheral pick-up region and extending in a first direction; and
   an extending portion extending from the main body portion to the memory cell region, wherein a width of the extending portion narrower than a width of the main body portion, and the extending portion has a sidewall surface that is aligned with a sidewall surface of the main body portion;
   wherein the main body portions of the pick-up electrode stripes are arranged in a second direction that is different from the first direction.

2. The pick-up structure as claimed in claim 1, wherein the pick-up electrode stripes at least include a first pick-up electrode stripe, a second pick-up electrode stripe, a third pick-up electrode stripe and a fourth pick-up electrode stripe sequentially arranged in the second direction, and wherein the main body portions of the pick-up electrode stripes have the same length.

3. The pick-up structure as claimed in claim 2, wherein the first pick-up electrode stripe and the second pick-up electrode stripe are in a mirror-symmetrical arrangement, and the third pick-up electrode stripe and the fourth pick-up electrode stripe are in a mirror-symmetrical arrangement.

4. The pick-up structure as claimed in claim 2, wherein the extending portion of the first pick-up electrode stripe is separated from the extending portion of the second pick-up electrode stripe by a first distance, and the main body portion of the first pick-up electrode stripe is separated from the main body portion of the second pick-up electrode stripe by a second distance, wherein the first distance is equal to the second distance.

5. The pick-up structure as claimed in claim 4, wherein the extending portion of the third pick-up electrode stripe is separated from the extending portion of the fourth pick-up electrode stripe by a third distance, and the main body portion of the third pick-up electrode stripe is separated from the main body portion of the fourth pick-up electrode stripe by a fourth distance, wherein the third distance is equal to the fourth distance and the first distance.

6. The pick-up structure as claimed in claim 4, wherein the extending portion of the second pick-up electrode stripe is separated from the extending portion of the third pick-up electrode stripe by a third distance, and the main body portion of the second pick-up electrode stripe is separated from the main body portion of the third pick-up electrode stripe by a fourth distance, wherein the third distance is greater than the fourth distance and the first distance.

7. The pick-up structure as claimed in claim 1, wherein the pick-up electrode stripes at least include a first pick-up electrode stripe, a second pick-up electrode stripe, a third pick-up electrode stripe and a fourth pick-up electrode stripe sequentially arranged in the second direction, and wherein a length of the main body portion of the second pick-up electrode stripe is equal to a length of the main body portion of the third pick-up electrode stripe, greater than a length of the main body portion of the first pick-up electrode stripe and less than a length of the fourth pick-up electrode stripe.

8. The pick-up structure as claimed in claim 1, wherein the extending portions of two of the pick-up electrode stripes are separated by a third distance, and two of the main body portions of the pick-up electrode stripes are separated by a fourth distance, wherein the third distance is greater than the fourth distance.

9. The pick-up structure as claimed in claim 1, wherein the main body portion of each of the pick-up electrode stripes is coupled to a word line of the memory device via the extending portion of each of the pick-up electrode stripes.

10. A method of forming a memory device, comprising:
successively forming a first masking layer, a sacrificial material layer and a second masking layer on a substrate, wherein the substrate has a memory cell region and a peripheral pickup region adjacent thereto;
forming a first pattern and a second pattern in the second masking layer, wherein the first pattern corresponds to the memory cell region and comprises a plurality of first stripe patterns arranged in parallel with each other, and the second pattern corresponds to the peripheral pick-up region and comprises a block pattern and a plurality of second stripe patterns connecting the block pattern and the first stripe patterns;
transferring the first pattern and the second pattern of the second masking layer into the sacrificial material layer, so that the sacrificial material layer has the first stripe patterns, the block pattern and the second stripe patterns;
removing the second masking layer having the first pattern and the second pattern;
forming a plurality of spacer layers over the first masking layer, so that sidewalls of each of the first stripe patterns and each of the second stripe patterns of the sacrificial material layer have corresponding spacer layers;
performing a first etching on the first masking layer by using the sacrificial material layer and the spacer layers as an etch mask;
after performing the first etching, removing the sacrificial material layer and leaving the spacer layers; and
performing a second etching on the first masking layer by using the spacer layers as an etch mask, so that the first masking layer has a third pattern.

11. The method as claimed in claim 10, further comprising:
before performing the second etching, forming a mask structure over the substrate and covering the spacer layers and the first mask layer, so that the spacer layers and the mask structure are used as an etch mask during the second etching, wherein the mask structure has a stripe pattern to define a select gate and stripe patterns to define pick-up electrode stripe patterns, and wherein each of the stripe patterns to define the pick-up electrode stripe patterns at least partially overlaps a vertical projection of each of the spacer layers.

12. The method as claimed in claim 11, further comprising:
before successively forming the first masking layer, the sacrificial material layer and the second masking layer, forming a target layer on the substrate; and
after forming the third pattern, transferring the third pattern into the target layer.

13. The method as claimed in claim 12, wherein after transferring the third pattern into the target layer, a plurality of pick-up electrode stripes is formed in the target layer corresponding to the peripheral pick-up region, and each of the pick-up electrode stripes comprises:
a main body portion in the peripheral pick-up region and extending in a first direction; and
an extending portion extending from the main body portion to the memory cell region, wherein a width of the extending portion is narrower than a width of the main body portion, and the extending portion has a sidewall surface that is aligned with a sidewall surface of the main body portion,
wherein the main body portions of the pick-up electrode stripes are arranged in a second direction that is different from the first direction.

14. The method as claimed in claim 13, wherein the main body portions of the pick-up electrode stripes have the same length.

15. The method as claimed in claim 13, wherein the pick-up electrode stripes at least include a first pick-up electrode stripe, a second pick-up electrode stripe, a third pick-up electrode stripe and a fourth pick-up electrode stripe sequentially arranged in the second direction, and wherein a length of the main body portion of the second pick-up electrode stripe is equal to a length of the main body portion of the third pick-up electrode stripe, longer than a length of the main body portion of the first pick-up electrode stripe, and shorter than the main body portion of the fourth pick-up electrode stripe.

16. The method as claimed in claim 10, wherein the block pattern is a rectangular pattern, and the second stripe patterns are arranged along a long side of the rectangular pattern.

17. The method as claimed in claim 10, wherein the block pattern is a trapezoid-liked pattern, and wherein a beveled side of the trapezoid-liked pattern has a multi-step contour, and the second stripe patterns are arranged along the beveled side of the trapezoid-liked pattern.

18. The method as claimed in claim 10, further comprising:
after forming the spacer layers, defining a cutting region on the spacer layers, wherein the cutting region extends in a direction substantially parallel to an arrangement direction of the second stripe patterns, and overlaps with the spacer layers adjacent to the junctions of the block pattern and the second stripe patterns, as viewed from a top-view perspective; and
removing the spacer layers in the cutting region.

19. The method as claimed in claim 10, further comprising:

after forming the spacer layers, defining a plurality of cutting regions on the spacer layers, wherein the plurality of cutting regions extends in a direction substantially perpendicular to an arrangement direction of the second stripe patterns and located between the second stripe patterns to overlap with the spacer layers adjacent to the junctions of the block pattern and the second stripe patterns, as viewed from a top-view perspective; and removing the spacer layers in the plurality of cutting regions.

* * * * *